United States Patent [19]

Burrows

[11] Patent Number: 5,125,098
[45] Date of Patent: Jun. 23, 1992

[54] FINITE STATE-MACHINE EMPLOYING A CONTENT-ADDRESSABLE MEMORY

[75] Inventor: James L. Burrows, Merrimack, N.H.

[73] Assignee: Sanders Associates, Inc., Nashua, N.H.

[21] Appl. No.: 418,412

[22] Filed: Oct. 6, 1989

[51] Int. Cl.⁵ .......................... G06F 9/00; G06F 9/44
[52] U.S. Cl. ................................. 395/800; 364/253; 364/259; 364/DIG. 2; 395/375
[58] Field of Search ... 364/200 MS File, 900 MS File; 395/800

[56] References Cited

U.S. PATENT DOCUMENTS

| | | | |
|---|---|---|---|
| 3,372,381 | 5/1968 | Raspanti | 340/172.5 |
| 3,430,203 | 2/1969 | Crawford | 340/172.5 |
| 3,435,422 | 3/1969 | Gerhardt et al. | 340/172.5 |
| 3,533,072 | 10/1967 | Clapper | 340/172.5 |
| 3,535,693 | 10/1970 | Connelly | 340/172.5 |
| 3,596,258 | 7/1971 | Choate et al. | 340/172.5 |
| 3,613,084 | 10/1971 | Armstrong | 340/172.5 |
| 3,700,866 | 10/1972 | Taylor | 235/150.1 |
| 3,716,840 | 2/1973 | Masten et al. | 340/172.5 |
| 3,725,875 | 4/1973 | Choate et al. | 340/172.5 |
| 3,868,655 | 2/1975 | Filippazzi | 340/173 |
| 3,878,542 | 4/1975 | Myer | 340/174 TF |
| 3,934,231 | 1/1976 | Armstrong | 340/172.5 |
| 3,949,368 | 4/1976 | West | 340/172.5 |
| 3,949,369 | 4/1976 | Churchill, Jr. | 340/172.5 |
| 3,969,707 | 7/1976 | Lane et al. | 340/173 |
| 4,010,452 | 3/1977 | Cazanove | 340/172.5 |
| 4,056,845 | 11/1977 | Churchill, Jr. | 364/200 |
| 4,062,001 | 12/1977 | Baker | 365/49 |
| 4,068,305 | 1/1978 | Cutler | 364/200 |
| 4,075,689 | 2/1978 | Berkling | 364/200 |
| 4,084,235 | 4/1978 | Hirtle et al. | 364/200 |
| 4,084,260 | 4/1978 | Fleming et al. | 364/900 |
| 4,164,025 | 8/1979 | Dubnowski et al. | 364/900 |
| 4,254,476 | 3/1981 | Burrows | 364/49 |
| 4,296,475 | 10/1981 | Nederlof et al. | 364/900 |
| 4,327,407 | 4/1982 | Burrows | 364/200 |
| 4,342,093 | 7/1982 | Miyoshi | 364/578 |
| 4,366,551 | 12/1982 | Holtz | 364/900 |
| 4,374,412 | 2/1983 | Schaffner | 364/200 |
| 4,377,855 | 3/1983 | Lavi | 365/49 |
| 4,385,371 | 5/1983 | Shafer et al. | 365/49 |
| 4,456,976 | 6/1984 | Savage | 365/49 |
| 4,458,310 | 7/1984 | Chang | 364/200 |
| 4,464,732 | 8/1984 | Clark | 364/900 |
| 4,475,194 | 10/1984 | LaVallee et al. | 371/10 |
| 4,484,266 | 11/1984 | Becker et al. | 364/200 |
| 4,494,191 | 1/1985 | Itoh | 364/200 |
| 4,504,907 | 3/1985 | Manning et al. | 364/200 |
| 4,507,748 | 3/1985 | Cotton | 364/749 |
| 4,513,374 | 4/1985 | Hooks, Jr. | 364/200 |
| 4,523,301 | 6/1985 | Kadota et al. | 365/49 |
| 4,527,249 | 7/1985 | Van Brunt | 364/578 |
| 4,532,606 | 7/1985 | Phelps | 365/49 |
| 4,538,243 | 8/1985 | Zehner | 365/49 |
| 4,546,428 | 10/1985 | Morton | 364/200 |
| 4,559,618 | 12/1985 | Houseman et al. | 365/49 |
| 4,575,798 | 3/1986 | Lindstrom et al. | 364/300 |
| 4,580,215 | 4/1986 | Morton | 364/200 |
| 4,583,169 | 4/1986 | Cooledge | 364/300 |
| 4,622,653 | 11/1986 | McElroy | 365/49 |
| 4,627,024 | 12/1986 | Whalen et al. | 364/900 |
| 4,630,234 | 12/1986 | Holly | 364/900 |
| 4,660,166 | 4/1987 | Hopfield | 364/807 |
| 4,670,858 | 6/1987 | Almy | 365/49 |
| 4,674,089 | 6/1987 | Poret et al. | 364/200 |
| 4,694,422 | 9/1987 | Kakuda et al. | 364/900 |

OTHER PUBLICATIONS

Wade, J. P. and C. G. Sodini, "Dynamic Cross-Coupled Bitline Content Addressable Memory Cell For High Density Arrays", *IEEE International Electron Devices Meeting*, 1985.

Primary Examiner—Thomas C. Lee
Assistant Examiner—Caleb Pollack
Attorney, Agent, or Firm—Cesari & McKenna

[57] ABSTRACT

A finite-state machine (30), which receives its input on INPUT lines (32) and generates its output on OUTPUT lines (34), is implemented with a content-addressable memory (46), whose output is the address of the location containing the data word presented to the content-addressable memory as its input. The content-addressable memory's input data word is the concatenation of the finite-state-machine input and the content-addressable-memory output, while the content-addressable-memory output is the output of the finite-state machine.

10 Claims, 3 Drawing Sheets

FINITE STATE-MACHINE EMPLOYING A CONTENT-ADDRESSABLE MEMORY

BACKGROUND OF THE INVENTION

1. Field of the Invention

This invention relates generally to the field of finite-state machines and, more particularly, to the implementation of a finite-state machine based on a content-addressable memory.

A finite-state machine is any device that can selectively assume any one of a finite plurality of states, that can change its state in response to its inputs and its current state, and that generates an output that depends at least on its stored state. It is usually described by a truth table that gives, for every possible combination of input and current state, what the output and next state will be.

In principle, of course, all digital circuits except purely combinatorial ones—i.e., all circuits that retain any "history"—are finite-state machines. However, the use of the term finite-state machine is used most commonly in connection with devices, such as sequencers and controllers, that are thought of most explicitly as sequencing through a plurality of states.

Finite-state machines of those types are often embodied programmable logic arrays (PLAs). FIG. 1 depicts an exemplary configuration of such a machine. The PLA 10 is a semi-custom array of gates containing fuses that can be blown to customize the array to achieve the desired Boolean relationship between the PLA input and the PLA output. For the sake of example, the PLA 10 is illustrated as receiving a forty-eight-bit input and generating a thirty-two-bit output.

The finite-state machine 12 of FIG. 1 receives as its input the DATA signal on lines 14 and generates its output on lines 16. At the beginning of each period of operation of the finite-state machine 12 there occurs a CLOCK1 pulse, which is followed by a CLOCK2 pulse. When the CLOCK1 pulse arrives, it causes two latches 18 and 20 to latch in the values of the signals at their input ports. The result is that the forty-eight-bit PLA input thereafter consists of the values that the DATA signals and sixteen bits of the PLA output represented when the CLOCK1 pulse arrived. That is, the PLA output depends not only on the last DATA input but also on the last output of the PLA, and this feedback of the last output is what gives the circuit its state characteristics.

The sixteen bits of the PLA output on lines 22 are those that are used as the machine output, and a further latch 24 latches those bits for presentation on lines 16 on the occurrence of CLOCK2, which occurs after the PLA outputs have settled.

The arrangement of FIG. 1 provides simplicity and economy, but it lacks flexibility, because the Boolean relationship between the PLA input and its output is fixed when the PLA is initially programmed: the PLA is not reprogrammable, and this can be a drawback in certain finite-state-machine applications, in which frequent reprogramming is necessary. To overcome this drawback, it has been proposed to employ a read/write random-access memory (RAM) to establish the relationship between input and output. The RAM essentially contains the finite-state-machine truth table: each RAM address is the concatenation of a machine output and a current machine state, and the content of each RAM location is the concatenation of the output and next state that should result from the input and current state that the output represents.

FIG. 2 depicts an example of such an arrangement. The fourteen address bits of a 16K × 16 RAM are divided into seven next-state bits and seven bits of machine input, while the sixteen RAM output data bits are divided into nine bits of machine output and the seven bits of next-state information that the address input port receives.

Since the RAM is a read/write memory, this arrangement provides the reprogrammability that the PLA arrangement does not, and it is therefore a beneficial alternative in many situations in which reprogrammability is necessary. Unfortunately, the RAM arrangement is impractical for relatively large input-word sizes or very large numbers of states, since the necessary size of the RAM increases exponentially with both quantities. If the RAM approach were to be used for the word size and number of states assumed in connection with FIG. 1, for instance, the RAM size would have to be on the order of hundreds of trillions of thirty-two-bit locations. Few applications occur in which a memory of that size is practical.

SUMMARY OF THE INVENTION

The present invention achieves the reprogrammability of the RAM arrangement without, in most cases, the size penalty that the RAM arrangement exacts for large input-word sizes. According to the present invention, the Boolean relationships are stored in a content-addressable memory. A content-addressable memory (CAM) is a memory that can be addressed by its contents; that is, it contains not only a memory cell for storing a binary digit (bit) of binary data, but includes a digital comparator which compares bits in the same position in subsequent data input with all stored bits in the same position, all in parallel. If all bits match those in a stored word, the CAM generates an output indicating the occurrence of a match. In one type of content-addressable memory, the CAM generates as its output the address of the location containing the key word that the CAM receives as its input.

The CAM arrangement is like the RAM arrangement in that at least part of the CAM output represents the next state and is fed back as part of the CAM input. The remainder of the CAM input is the machine input. Thus, the CAM input is just as long as the RAM input for the same finite-state machine. Since the CAM input addresses contents rather than locations, however, the increase in CAM size with input-word length can be as low as linear rather than exponential as is required by RAM embodiments.

BRIEF DESCRIPTION OF THE DRAWINGS

These and further features and advantages of the present invention are described in connection with the accompanying drawings, in which.

DETAILED DESCRIPTION OF ILLUSTRATIVE EMBODIMENTS

Figure 1:
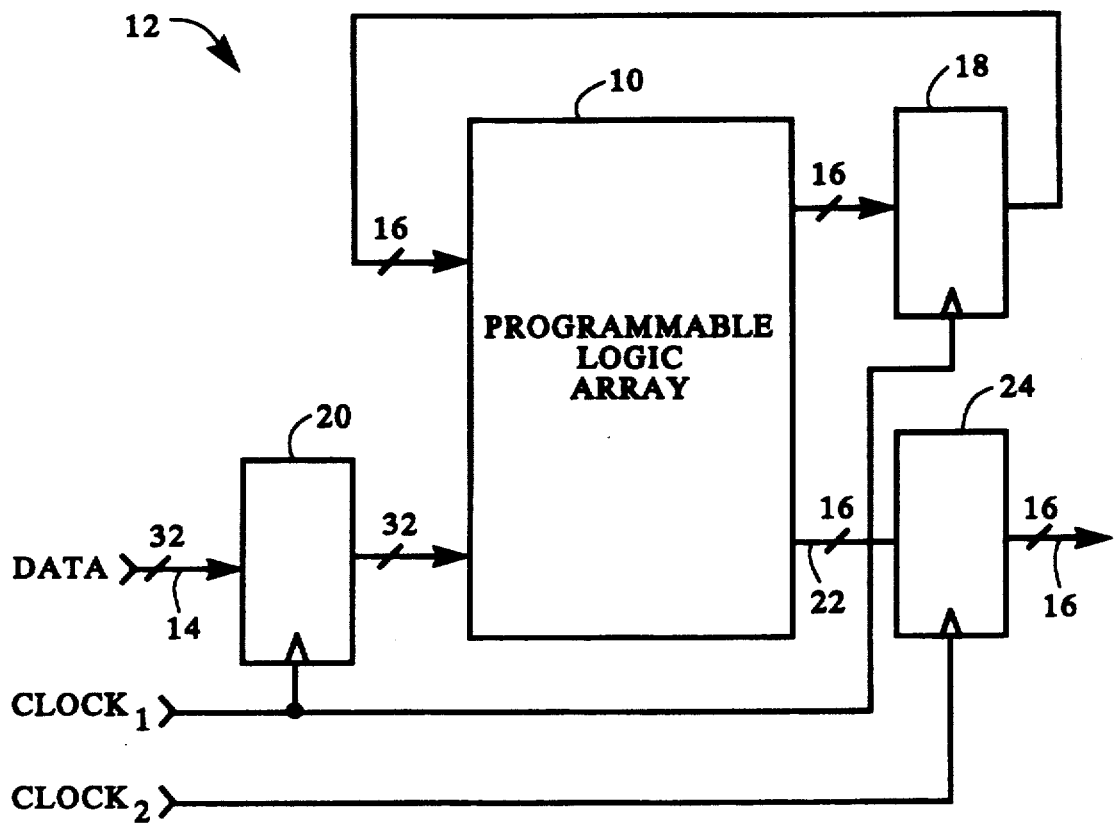
FIG. 1 is a block diagram of a prior-art finite-state machine employing a programmable logic array.
Figure 2:
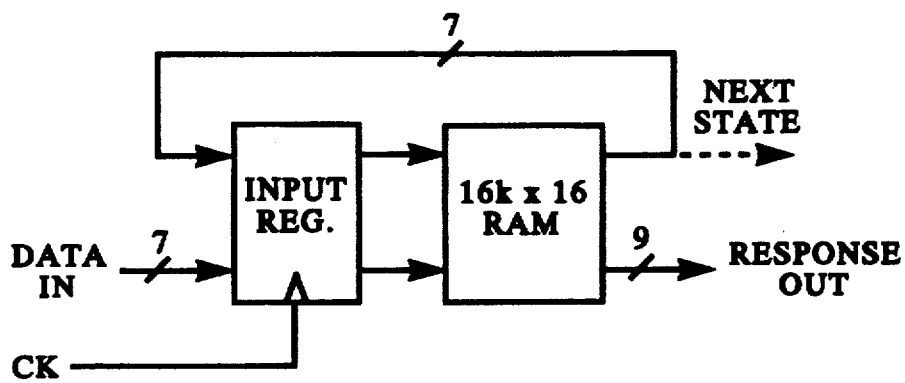
FIG. 2 is a block diagram of a prior-art finite-state machine employing a RAM.
Figure 3:
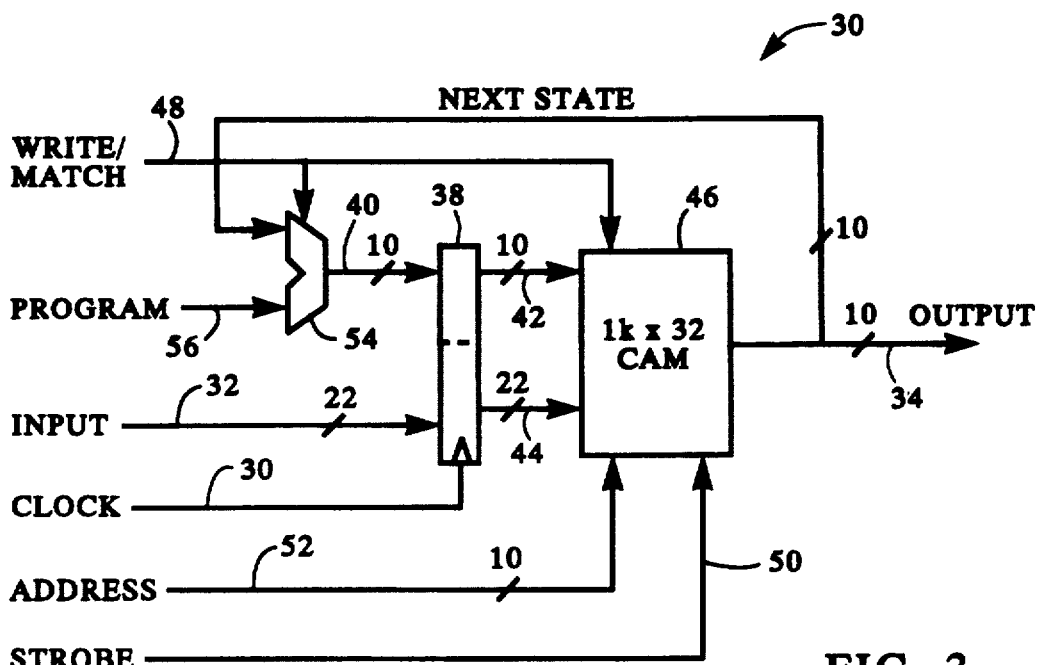
FIG. 3 is a block diagram of a simple embodiment of the present invention.

FIG. 3 depicts a finite-state machine 30. The machine INPUT signal is applied on machine input lines 32, its OUTPUT appears on lines 34, and pulses that indicate when the next state is to be assumed appear in a CLOCK signal on line 36. The CLOCK signal advances the finite-state machine by clocking a latch 38. The latch thereupon loads in the value represented by the DATA signal as well as that represented by a NEXT STATE signal on lines 40, which, in the embodiment of FIG. 3, is the same as the machine output on lines 34.

The latch holds the value that the NEXT STATE signal represented when the last CLOCK pulse arrived, and it applies this value to feedback lines 42 to indicate the current state. It similarly drives data lines 44 with the value that INPUT assumed on the occurrence of the last CLOCK pulse. Together, the signals on the feedback and data lines 42 and 44 represent a "key word," for which a content-addressable memory ("CAM") 46 will search its memory locations and in response will generate the OUTPUT signal on lines 34.

Various types of CAM architectures have been proposed. Among them are those described in Wade and Sodini, "Dynamic Cross-Coupled Bitline Content Addressable Memory Cell for High Density Arrays," *IEEE International Electron Devices Meeting*, Dec. 1985, and Hnatek, *A User's Handbook of Semiconductor Memories* pp 593 et seq. (John Wiley & Sons, 1977). Despite their variation in architecture, all of these CAMs have a mode in which they are addressable by their contents; that is, instead of specifying the address of one location whose contents are to be fetched, the CAM input specifies contents—a "key word"—for which the CAM is to search all of its locations. In this mode, the output of the CAM is an output word associated with the location in which the key word was found.

In the illustrated embodiment, that output word is the address of the location that contains the key word. Accordingly, each location represents a next state, and its contents are the combination of current state and input that are to result in the next state represented by the address of the location. Before the circuit is used as a finite-state machine, therefore, the CAM must be programmed with such contents.

Programming is achieved by writing to the CAM in a manner more or less the same as that in which one writes into a RAM. For this purpose, the CAM may receive, for instance, a WRITE/MATCH signal on line 48 to indicate whether it is to operate in the matching mode or in the writing mode. (Some such memories also have a reading mode, in which the contents can be read in the manner conventionally employed with a RAM, but such a feature is not necessary for present purposes.) When the WRITE/MATCH signal indicates the writing mode, application of a STROBE signal on line 50 causes the value represented by the signals on lines 42 and 44 to be loaded into the location whose address is contained on lines 52. A multiplexer 54 may be interposed in the NEXT STATE line 40 so that the value of the signals on lines 42 can be set independently of the OUTPUT signal. That is, for programming purposes, the CAM input is determined by the signals on the INPUT lines 32 and separate PROGRAM lines 56.

A CAM may have other input and output terminals, not shown, which are not of interest in the present context. A match line may be provided, for instance, to indicate whether any match has occurred, but such a line is superfluous in the present context, since the CAM will have been programmed in such a manner that there is always a match in ordinary finite-state-machine operation. There similarly is no need for the lines used to read out multiple matches, since a CAM properly programmed for use in a finite-state machine will contain any given key word in only one location. Furthermore, the particular CAM employed may use other signals for timing purposes. Since all of these signals are provided in the manner conventionally employed in connection with the particular CAM chosen, all of these signals are omitted from the description for the sake of simplicity.

The advantages of the finite-state machine of FIG. 3 can be appreciated by comparing the size of CAM 46 with the size that would be required of a RAM used to realize a finite-state machine of the same size. In the arrangement of FIG. 3, the number of states is 1024 ("1K"), and the total of the lengths of the machine input word and the encoded state number is thirty-two. If each state is required by only one combination of machine input and previous state, then the number of locations is determined by the number of states. Consequently, the size of the CAM 46 is $1K \times 32$. In contrast, the size required of a RAM, whose required number of locations is exponentially related to the total of the lengths of the machine input word and the encoded state number, is more than $4 \times 10^9$ ten-bit words. That is, the RAM would have to be a million times as big as the CAM.

One might object at this point that the example was "cooked" to give the CAM arrangement an extreme advantage over the RAM arrangement; ordinarily, many states result from more than one combination of input word and previous state, so the number of CAM locations would typically have to be several times the number of possible states. In such a situation, there would have to be several CAM locations for each state, and the state represented by a location would be the first ten bits of its address, which would now have to be more than ten bits, since there would have to be more than 1K locations.

It is true that the foregoing example was picked to emphasize the advantages of a CAM arrangement over a RAM arrangement and that the advantages will not be as pronounced in every situation. In fact, if every possible twenty-two-bit number were a valid input, and if every input could occur with every state, the CAM would actually have to be larger than the RAM. In most applications, however, the number of "legal" input words is a very small fraction of the number that the input-word length could theoretically support. Moreover, of even the "legal" input words, not all can occur in every state. The foregoing example illustrates that the CAM arrangement takes advantage of these facts, while the RAM arrangement does not, and the difference in required size can be striking.

Moreover, there is a feature of many CAM architectures that can further reduce the size of the required CAM. Many CAMs are "trit" CAMs; i.e., the possible contents of a memory cell are not just one and zero but also an X, i.e., a "don't care," value. When a cell in such a CAM contains an X, the CAM reports a match in that cell regardless of whether the corresponding bit in the input key word is a one or a zero. This allows a further reduction in memory size because it often occurs that only one or just a few bits of the input word are to have any effect when the machine is in a certain state, even though a very large number of input words are possible in that state.

For example, suppose that all $2^{22}$ input words can be encountered when the machine is in state $0257_8$. Without the trit architecture, it would take $2^{22}$ memory locations to provide for that state because separate contents are necessary for every input that can occur in that state. This would be true even if the intended output and next state are always the same when the state is $0257_8$. In contrast, the trit architecture would require only a single location, one in which all bits except those that correspond to the state name would be Xs (don't cares). Such a location would result in a match no matter what the input is so long as the state is $0257_8$.

Accordingly, although there are some situations in which the CAM architecture is not preferable, it is possible to realize using CAMs, at modest cost, many reprogrammable finite-state machines that would be completely impractical to realize using RAMs.

Although the embodiment of FIG. 3 demonstrates the significant advantages of a CAM-based finite-state machine, it omits some capabilities that might be desired in certain applications. For example, although the output on line 34 and the next state on line 40 are the same in FIG. 3, it is often necessary for the output to differ or be independent from the next state.

Figure 4:
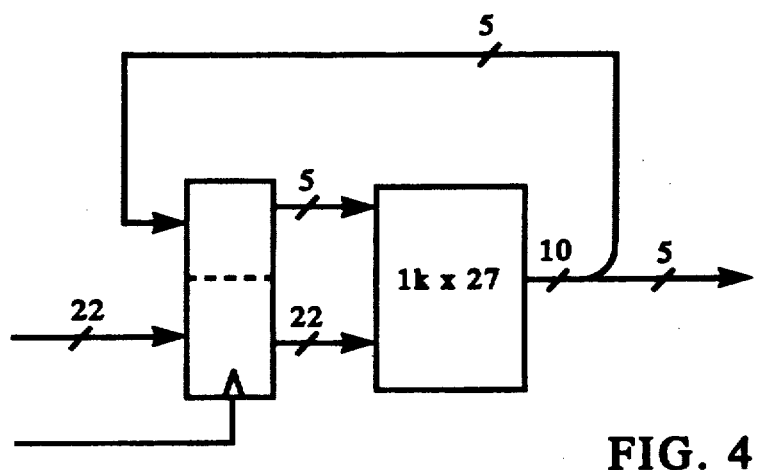
FIG. 4 is a block diagram of an alternate embodiment of the present invention.

One possible way to achieve the desired difference is to use the arrangement depicted in FIG. 4, from which the multiplexer and certain input lines have been omitted for the sake of simplicity. The FIG. 4 arrangement is the same as that of FIG. 3 with the exception that only part of the address is used as the next state and the rest is used as the machine output. Although the FIG. 4 arrangement achieves the desired result of producing an output different from the next state, it does so at a large cost in output-word size and number of states. This is a result of the fact that the machine output and next state are still parts of the CAM address. Flexibility is increased if one or both of the machine output and next state can be decoupled from the CAM address.

A way to achieve this result is to make the output word associated with a location programmable just as the key-word contents are. In the two embodiments described so far, the output word associated with a location is fixed: it is the address of the location. The arrangement of FIG. 5 decouples the address from the output and next state by making the output word programmable. By a modest increase in memory size, the arrangement of FIG. 5 provides a great increase in output-word length and number of states over the arrangement of FIG. 4.

Figure 5:
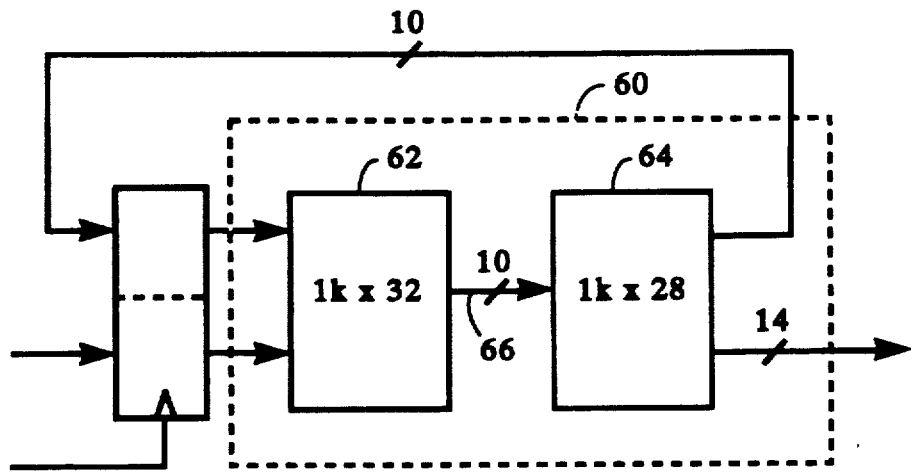
FIG. 5 is a block diagram of a further embodiment of the present invention.

In FIG. 5, a content-addressable memory 60 actually includes two memories, one of which, memory 62, is itself a content-addressable memory of the type depicted in FIGS. 3 and 4. The other memory 64 is a conventional RAM. The output word of memory 62 is the address of the location at which the match occurred. This output word is applied on lines 66 to the address port of RAM 64, which has been programmed to contain the next state and output that are to result from the current state and input contained in the corresponding location in CAM 62. Although the address signals on lines 66 are in encoded form—i.e., lines 66 do not include a separate conductor for each row and column—one might dispense with part or all of the encoding and subsequent decoding if both of the memories 62 and 64 are fabricated in a single chip. That is, the address signals would typically be sent in decoded form in a single-chip embodiment. In both encoded and decoded arrangements, each CAM location and its associated RAM location can be thought of together as a single composite location containing both a programmable key word and a programmable output word.

Figure 6:
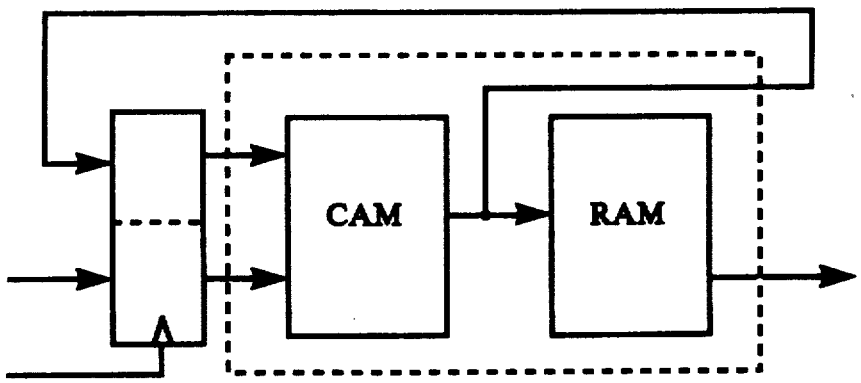
FIG. 6 is a block diagram of another embodiment of the present invention.
Figure 7:
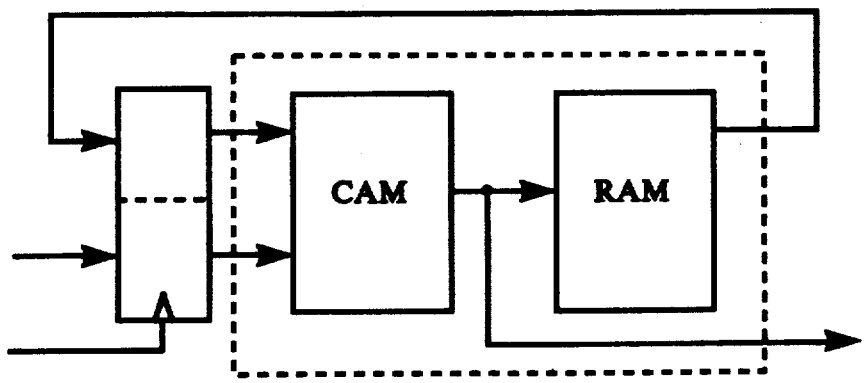
FIG. 7 is a block diagram of yet another embodiment of the present invention.

In the alternative, one might employ one of the arrangements of FIGS. 6 and 7, which are hybrids of the arrangements of FIGS. 4 and 5. Specifically, the FIG. 6 arrangement uses the CAM address output as next-state feedback but uses the RAM data output as the machine output. The FIG. 7 arrangement reverses these roles.

It is apparent that the teachings of the present invention can be used in a wide variety of embodiments and still achieve the benefits of reprogrammability without requiring the large memory sizes often necessitated by designs that use conventional RAMs. The present invention thus constitutes a significant advance in the art.

What is claimed as new and desired to be secured by Letters Patent of the United States is:

1. A finite-state machine, operable in cycles, comprising:
    A. a content-addressable memory, including a key-word port comprising a feedback port and machine input port, at least one output port, and a plurality of storage locations having respective output words associated therewith, for (i) operating in one mode to receive key-word and location-identification signals and to store the key words represented by the key-word signals in the locations identified by the location-identification signals and (ii) operating in another mode to generate at its output port, in response to reception at its key-word port of an input representing a key word, a memory output representing the output word associated with the storage location that contains the key word represented by the input signals at the key-word port;
    B. feedback means for applying to the feedback port during a current cycle a feedback signal determined by the memory output of the previous cycle; and
    C. output means for generating a machine output determined by the memory output, whereby the finite-state machine generates a machine output determined by the previous memory output and a machine input received at the machine input port.

2. A finite-state machine as defined in claim 1 wherein the feedback means includes:
    A. a random-access memory, including a data port, an address port connected to receive at least part of the memory output of the content-addressable memory, and a plurality of RAM locations containing data contents and having unique addresses associated therewith, for generating at its data port data signals representative of the contents of the RAM location associated with the address represented by the signals received at its address input port; and
    B. means for applying at least part of the data signals of the previous cycle to the feedback port as the feedback signal of the current cycle.

3. A finite-state machine as defined in claim 2 wherein the output means includes the random-access memory and means for providing at least part of the data signals as the machine output.

4. A finite-state machine as defined in claim 2 wherein:
   A. each storage location of the content-addressable memory is associated with a unique address; and
   B. the memory output is a decoded representation of the address associated with the storage location that contains the key word represented by signals at the key-word port.

5. A finite-state machine as defined in claim 2 wherein:
   A. each storage location of the content-addressable memory is associated with a unique address; and
   B. the memory output is an encoded representation of the address associated with the storage location that contains the key word represented by signals at the key-word port.

6. A finite-state machine as defined in claim 1 wherein the output means includes:
   A. a random-access memory, including a data port, an address port connected to receive at least part of the memory output of the content-addressable memory, and a plurality of RAM locations containing data contents and having unique addresses associated therewith, for generating at its data port data signals representative of the contents of the RAM location associated with the address represented by the signals received at its address input port; and
   B. means for providing at least part of the data signals as the machine output.

7. A finite-state machine as defined in claim 6 wherein the feedback means comprises means for applying at least part of the memory output of the previous cycle to the feedback port as the feedback signal of the current cycle.

8. A finite-state machine as defined in claim 6 wherein:
   A. each storage location of the content-addressable memory is associated with a unique address; and
   B. the memory output is a decoded representation of the address associated with the storage location that contains the key word represented by signals at the key-word port.

9. A finite-state machine as defined in claim 6 wherein:
   A. each storage location of the content-addressable memory is associated with a unique address; and
   B. the memory output is an encoded representation of the address associated with the storage location that contains the key word represented by signals at the key-word port.

10. A finite-state machine as defined in claim 1 wherein the output word associated with each storage location is a unique address thereof.

* * * * *